US007862736B2

United States Patent
Nakayama

(10) Patent No.: US 7,862,736 B2
(45) Date of Patent: Jan. 4, 2011

(54) METHOD OF CLEANING PLASMA ETCHING APPARATUS, AND THUS-CLEANABLE PLASMA ETCHING APPARATUS

(75) Inventor: Tomoo Nakayama, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 990 days.

(21) Appl. No.: 11/633,530

(22) Filed: Dec. 5, 2006

(65) Prior Publication Data

US 2007/0131245 A1 Jun. 14, 2007

(30) Foreign Application Priority Data

Dec. 8, 2005 (JP) ............................. 2005-354612

(51) Int. Cl.
*H01L 21/00* (2006.01)
(52) U.S. Cl. ............... 216/60; 156/345.24; 156/345.25; 156/345.26; 156/345.27
(58) Field of Classification Search .................. 134/1.1; 156/345.24, 345.25, 345.26; 216/60
See application file for complete search history.

(56) References Cited

U.S. PATENT DOCUMENTS 6,189,482 B1 * 2/2001 Zhao et al. .............. 118/723 R
6,903,025 B2 * 6/2005 Mizushima ............... 438/706
2003/0000546 A1 * 1/2003 Richardson et al. ........... 134/1.1

FOREIGN PATENT DOCUMENTS

| JP | 10-74732 | 3/1998 |
| JP | 2004-235361 | 8/2004 |

\* cited by examiner

*Primary Examiner*—Ram N. Kackar
(74) *Attorney, Agent, or Firm*—Young & Thompson

(57) ABSTRACT

Method of cleaning a plasma etching apparatus capable of suppressing variation in line width among wafers in a single lot, and improving throughput in the cleaning process, includes steps of supplying a cleaning gas into a chamber of a plasma etching apparatus; igniting a plasma of the cleaning gas in the chamber; and allowing plasma cleaning to proceed in the chamber, by bringing the cleaning gas in plasma form into contact with a deposit adhered on the inner wall of the chamber so as to etch off the deposit, wherein in the step of plasma cleaning in the chamber, intensity of plasma emission ascribable to the deposit adhered on the inner wall of the chamber is detected in a time-dependent manner, and the plasma cleaning in the chamber is terminated based on changes in the intensity of the plasma emission.

5 Claims, 8 Drawing Sheets

METHOD OF CLEANING PLASMA ETCHING APPARATUS, AND THUS-CLEANABLE PLASMA ETCHING APPARATUS

This application is based on Japanese patent application No. 2005-354612 the content of which is incorporated hereinto by reference.

BACKGROUND

1. Technical Field

The present invention relates to a method of cleaning a plasma etching apparatus, and thus-cleanable plasma etching apparatus.

2. Related Art

With advance in generation of semiconductor devices, line pitch has been becoming narrower, and demands for dimensional accuracy in etching and other processes have been becoming more strict. Etching process has been proceeded by handling a plurality of wafers as one lot, wherein dimensional variation among the wafers has sometimes occurred with progress of pollution in a chamber of the etching apparatus. It is, therefore, a general practice to clean the inside of the chamber after the etching.

One of conventional plasma cleaning methods is such as described in Japanese Laid-Open Patent Publication No. H10-74732. The plasma cleaning method described in this publication is such as carrying out plasma cleaning, after completion of etching, using hydrogen chloride or a mixed gas of hydrogen chloride and chlorine, or hydrogen bromide or a mixed gas of hydrogen bromide and bromine as a cleaning gas.

Japanese Laid-Open Patent Publication No. 2004-235361 describes a method of manufacturing a semiconductor device, wherein in the process of etching a semiconductor wafer, the end point of dry etching is determined based on changes in intensity of plasma emission.

However, the conventional techniques described in the above publications still have a room for improvement.

First, the plasma cleaning method described in Japanese Laid-Open Patent Publication No. H10-74732 did not specify the end point of the cleaning. The method could therefore achieve only a limited degree of cleanliness of the inner wall of the chamber, and sometimes resulted in variation in line pitch among wafers in a single lot.

It has been a general situation that the conventional plasma cleaning was carried out for a constant duration of time, irrespective of the amount of deposit adhered on the inner wall of the chamber. The deposit might, therefore, remain adhered on the inner wall of the chamber even after the plasma cleaning, and might result in an insufficient cleanliness of the inner wall of the chamber. Moreover, the cleanliness of the inner wall of the chamber varied in the etching process repeated a plurality of times.

Relation between the cleanliness of the inner wall of the chamber and the variation in line pitch among wafers in a single lot is supposed as follows, although it is not completely clarified. More specifically, in the etching process, products derived from the etching gas adhere on the inner wall of the chamber and the wafer surface. Ratio of adhesion of the products ascribable to the etching gas between the inner wall of the chamber and the wafer varies, if the cleanliness of the inner wall of the chamber is insufficient in the succeeding cleaning process, and thereby the amount of deposition on the surface of wafer increases. For this reason, the variation in the line pitch is supposed to vary among wafers in a single lot.

Second, the method described in Japanese Laid-Open Patent Publication No. H10-74732 did not specify the end point of the cleaning, and sometimes resulted in an excessive cleaning time, thereby sometimes degrading the throughput.

In recent years, there has been an increasing trend of using an exposure apparatus using an ArF excimer laser (193 nm in wavelength) as a light source, aiming at achieving a fine line pitch. An ArF resist adaptive to the exposure apparatus is therefore used. The ArF resist has, however, a poor resistivity, needs etching proceeded under a low energy, and consequently needs a longer time for etching. Moreover, the conventional method never confirmed the end point of cleaning after the etching, and thereby occasionally resulted in an unnecessarily long time for the cleaning. As a consequence, the etching process as a whole including the cleaning process has sometimes been elongated, and has, in particular, resulted in degradation of the throughput.

As has been described in the above, there has been demands for a method of cleaning a plasma etching apparatus and a thus-cleanable plasma etching apparatus, capable of suppressing the variation in line pitch among wafers in a single lot, and of improving the throughput in the etching process.

SUMMARY OF THE INVENTION

According to the present invention, there is provided a method of cleaning a plasma etching apparatus, which includes supplying a cleaning gas into a chamber of a plasma etching apparatus; igniting a plasma of the cleaning gas in the chamber; and allowing plasma cleaning to proceed in the chamber, by bringing the cleaning gas in a plasma form into contact with a deposit adhered on the inner wall of the chamber so as to etch off the deposit, wherein in the allowing plasma cleaning to proceed in the chamber, intensity of plasma emission ascribable to the deposit adhered on the inner wall is detected in a time-dependent manner, and the plasma cleaning in the chamber is terminated based on changes in the intensity of the plasma emission.

According to the present invention, there is also provided a plasma etching apparatus having:

a chamber allowing etching of a sample placed therein to proceed;

a gas supply unit supplying a cleaning gas into the chamber;

a plasma generation unit igniting a plasma of the cleaning gas in the chamber;

an emission intensity detection unit detecting, in a time-dependent manner, intensity of plasma emission generated when the plasma comes into contact with a deposit adhered on the inner wall of the chamber; and a control unit terminating the plasma cleaning in the chamber, based on intensity of the plasma emission detected by the emission intensity detection unit.

These inventions allows confirmation of the end point of plasma cleaning based on plasma emission intensity. A desired level of cleanliness of the inner wall of the chamber can therefore be understood, so that the cleanliness of the inner wall of the chamber at the end point of the cleaning can be kept constant. As a consequence, the process is prevented from advancing to the next step while being remained in a poor state of cleaning, and thereby the variation in line pitch among wafers in a single lot can be suppressed. In addition, the throughput in the etching process can be improved, because the process can advance to the next step after confirming the end point of the plasma cleaning.

According to the present invention, there is provided an additional step of introducing an inert gas into the chamber, after the step of terminating the plasma cleaning in the chamber.

According to the present invention, the dimensional variation in line pitch among wafers in a single lot can effectively be suppressed, and the throughput in the etching process can further be improved.

It is to be noted that the inert gas in the present invention includes rare gases and nitrogen gas.

The method of cleaning a plasma etching apparatus and thus-cleanable plasma etching apparatus of the present invention can suppress the variation in line pitch in a single lot, and can improve the throughput in the etching process.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1:
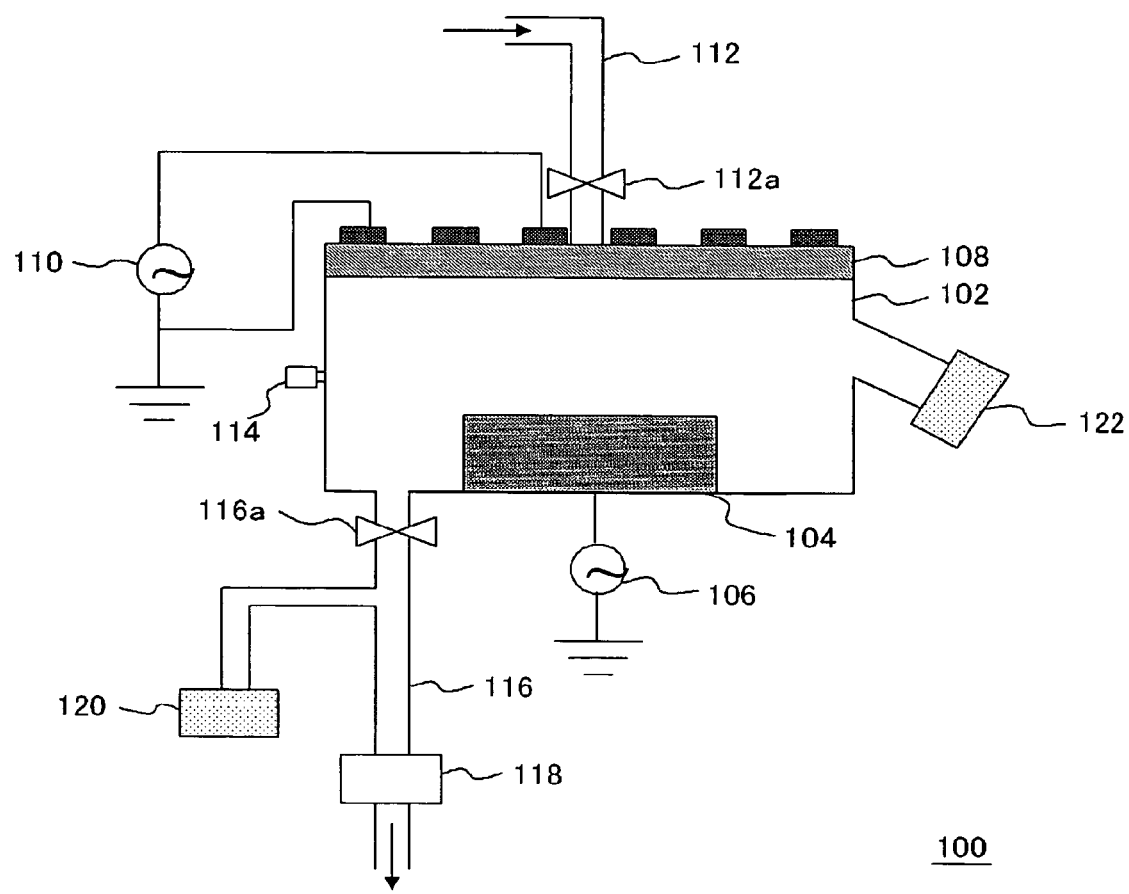
FIG. 1 is a sectional view schematically showing a configuration of a plasma etching apparatus in one embodiment.

The invention will be now described herein with reference to an illustrative embodiment. Those skilled in the art will recognize that many alternative embodiments can be accomplished using the teachings of the present invention and that the invention is not limited to the embodiment illustrated for explanatory purposes.

Paragraphs below will explain embodiments of the present invention referring to the attached drawings. Any similar constituents will be given with the same reference numerals in all drawings, so as to occasionally avoid repetitive explanation. A plasma etching apparatus of this embodiment will be explained first.

[Plasma Etching Apparatus]

FIG. 1 is a sectional view schematically showing a configuration of a plasma etching apparatus of this embodiment.

As shown in FIG. 1, a plasma etching apparatus 100 has a chamber 102, a stage 104 disposed on the bottom portion of the chamber 102, and an upper electrode 108 disposed at the top portion of the chamber 102.

The chamber 102 further has a CCD camera 114 and a temperature sensor 122. The CCD camera 114 is connected to a plasma emission spectrometer (not shown). The CCD camera 114 monitors plasma emission, and the plasma emission spectrometer detects the plasma emission as an emission intensity, based on optical emission spectroscopy (OES). On the other hand, an infrared temperature sensor can be used as the temperature sensor 122. The temperature sensor 122 measures temperature of, for example, the inner wall of the chamber 102 on the upper electrode 108 side.

The stage 104 is used for placement of a wafer, and also functions as a lower electrode as being connected to a bias high-frequency power supply 106. The upper electrode 108 is provided so as to oppose with the stage 104, and is connected to the source high-frequency power supply 110. A gas introduction pipe 112 is connected to the top portion of the chamber 102, allowing therethrough supply of an etching gas and an inert gas into a space between the wafer placed on the stage 104 and the upper electrode 108. The gas introduction pipe 112 is connected to a plurality of gas bombs (not shown) as being switchable thereamong, so as to introduce a desired gas into the chamber 102 by opening and closing a valve 112a.

The chamber 102 has a gas discharge pipe 116 connected thereto, allowing therethrough discharge of a gas in the chamber with the aid of an evacuation pump 118 provided to the gas discharge pipe 116. A TMP (turbo molecular pump), for example, can be used as the evacuation pump 118. In midway of the gas discharge pipe 116, a gas analyzer 120 is provided so as to allow analysis of an exhaust gas. A mass spectral analyzer, for example, can be used as the gas analyzer 120. The gas discharge pipe 116 has a valve 116a provided thereto, so as to allow opening/closing of the gas discharge pipe 116.

Figure 2:
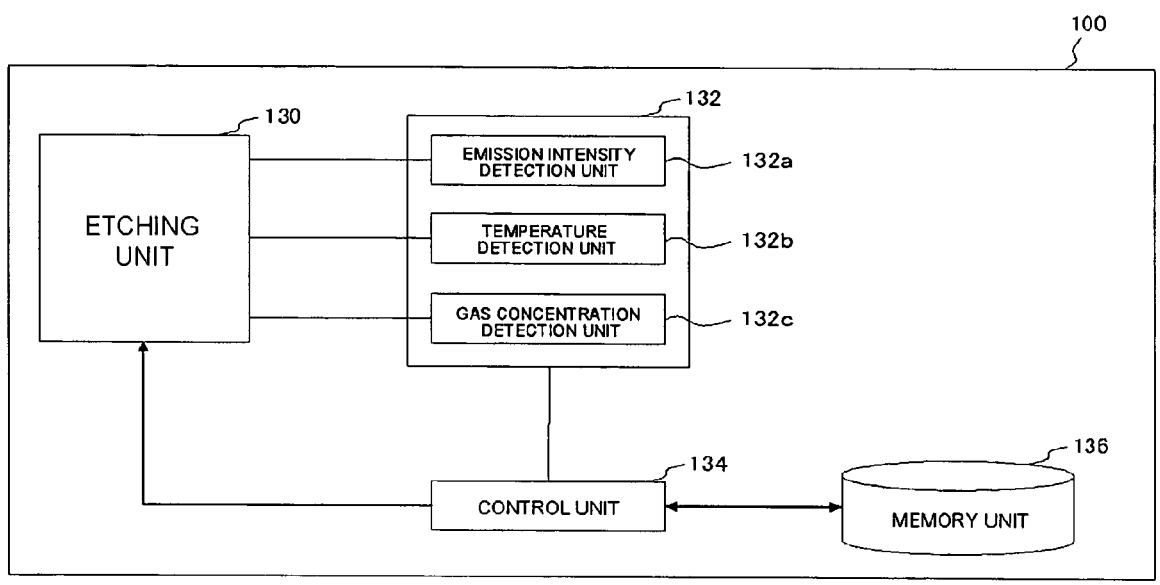
FIG. 2 is a functional block diagram of the plasma etching apparatus in the embodiment.

FIG. 2 is a functional block diagram of the plasma etching apparatus 100 of this embodiment.

As shown in FIG. 2, the plasma etching apparatus 100 includes an etching unit 130, a detection unit 132, a control unit 134 and a memory unit 136. The detection unit 132 includes an emission intensity detection unit 132a, a temperature detection unit 132b and a gas concentration detection unit 132c.

The etching unit 130 includes the chamber 102, shown in FIG. 1, allowing therein etching of a sample placed on the stage 104 to proceed, a gas supply unit (a gas bomb (not shown), the gas introduction pipe 112, and the valve 112a) supplying a cleaning gas into the chamber 102, and a plasma generation unit (the stage 104, the bias high-frequency power supply 106, the upper electrode 108, and the source high-frequency power supply 110) igniting a plasma of the cleaning gas in the chamber 102.

The emission intensity detection unit 132a corresponds to a CCD camera 114 attached to the chamber 102. The emission intensity detection unit 132a measures plasma emission in a predetermined wavelength range during the plasma cleaning based on optical emission spectroscopy (OES), while monitoring, using the CCD camera 114, the plasma emission ascribable to a deposit adhered on the inner wall of the chamber 102. The emission intensity detection unit 132a detects intensity of the plasma emission in the predetermined wavelength range in the chamber 102 in a time-dependent manner, based on the measured results.

The temperature detection unit 132b corresponds to a temperature sensor 122 attached to the chamber 102. The temperature detection unit 132b detects temperature of the inner wall of the chamber 102, based on the measured results obtained by the temperature sensor 122.

The gas concentration detection unit 132c corresponds to a gas analyzer 120 attached to the plasma etching apparatus 100. The gas concentration detection unit 132c detects gas concentration of a predetermined compound in the chamber 102, based on the measured results obtained by the gas analyzer 120.

The emission intensity detection unit 132a, the temperature detection unit 132b and the gas concentration detection unit 132c transmit these detection results obtained from the etching unit 130 to the control unit 134. The control unit 134 controls the etching unit 130, based on these results of detection. The memory unit 136 has information used for control of the etching unit 130 stored therein, and the control unit 134 controls the etching unit 130 while confirming the information in the memory unit 136.

Figure 3:
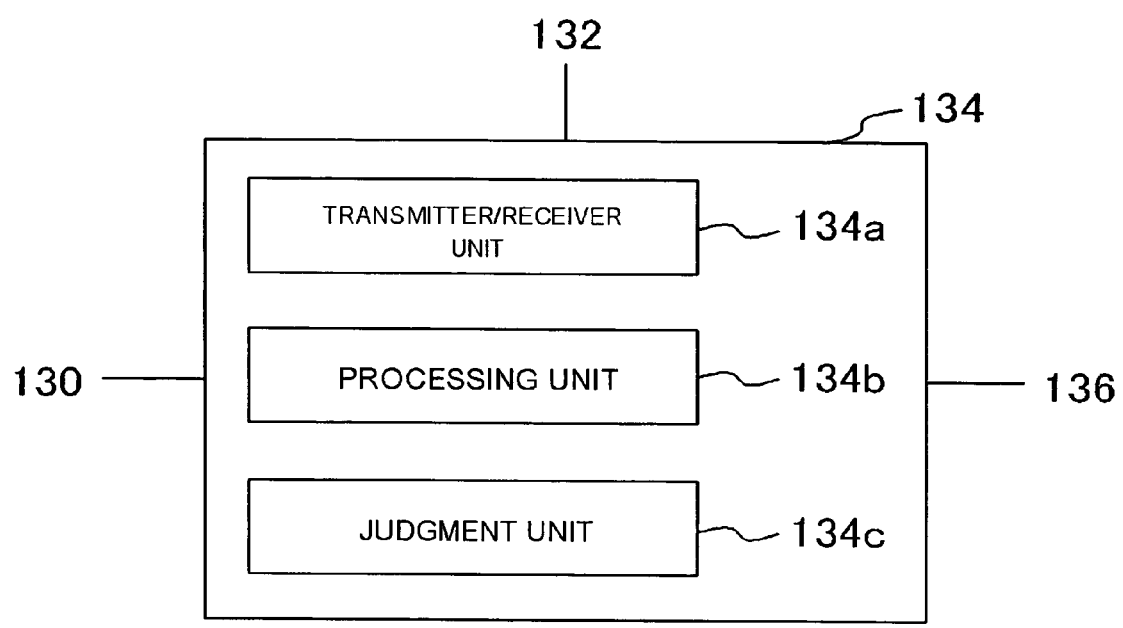
FIG. 3 is a functional block diagram of a control unit in the embodiment.

As shown in FIG. 3, the control unit 134 has a transmitter/receiver unit 134a, a processing unit 134b, and a judgment unit 134c.

The transmitter/receiver unit 134a receives results of detection from the emission intensity detection unit 132a, the temperature detection unit 132b and the gas concentration detection unit 132c, and transmits the results of detection to the processing unit 134b. The transmitter/receiver unit 134a further receives control signals based on results of judgment given by the judgment unit 134c, and transmits the signals to the etching unit 130.

The processing unit 134b calculates, based on the results of detection, the individual rates of changes (rate of change in emission intensity, rate of change in temperature, rate of change in gas concentration) in a predetermined period of time. The processing unit 134b transmits thus-calculated individual rates of changes to the judgment unit 134c.

The judgment unit 134c, upon receive of rate of change in emission intensity from the processing unit 134b, accesses the memory unit 136 to refer information stored therein, and judges whether the received rate of change in emission intensity indicates the end point of the plasma cleaning or not. It is also allowable herein to judge the end point of the plasma cleaning based on a certain value of emission intensity.

The judgment unit 134c, upon receive of rate of change in temperature or rate of change in gas concentration from the processing unit 134b, accesses the memory unit 136 to refer information stored therein, and judges whether the received rate of change in temperature or the rate or change in gas concentration indicates the end point of introduction of the inert gas. It is also allowable herein to judge the end point of introduction of the inert gas based on a certain value of temperature or gas concentration.

The memory unit 136 stores therein reference values which provide judgment criteria for determining completion of the plasma cleaning in the chamber 102, based on changes in plasma emission intensity. A plasma emission intensity of 2000, and a rate of change in plasma emission intensity per unit time of −20% or more and 5% or less, for example, are stored as the reference values. The judgment unit 134c compares the emission intensity or the rate of change in the emission intensity detected by the emission intensity detection unit 132a with either of the reference values.

The memory unit 136 also stores therein reference values which provide judgment criteria for determining completion of introduction of the inert gas into the chamber 102, based on changes in temperature of the inner wall of the chamber 102. A temperature of the inner wall of the chamber 102 of 60° C., and a rate of change in temperature of the inner wall of the chamber 102 per unit time of −20% or more and 5% or less, for example, are stored as the reference values. The judgment unit 134c compares the temperature or the rate of change in the temperature detected by the temperature detection unit 132b with either of the reference values.

The memory unit 136 still also stores therein reference values which provide judgment criteria for determining completion of introduction of the inert gas into the chamber 102, based on changes in gas concentration of a predetermined compound in the chamber 102. A gas concentration of a predetermined compound of 4%, and a rate of change in the gas concentration of a predetermined compound per unit time of −20% or more and 5% or less, for example, are stored as the reference values. The judgment unit 134c compares the rate of change in the gas concentration or the rate of change in the gas concentration detected by the gas concentration detection unit 132c with either of the reference values.

[Method of Cleaning Plasma Etching Apparatus]

Paragraphs below will explain a method of cleaning a plasma etching apparatus.

Figure 4:
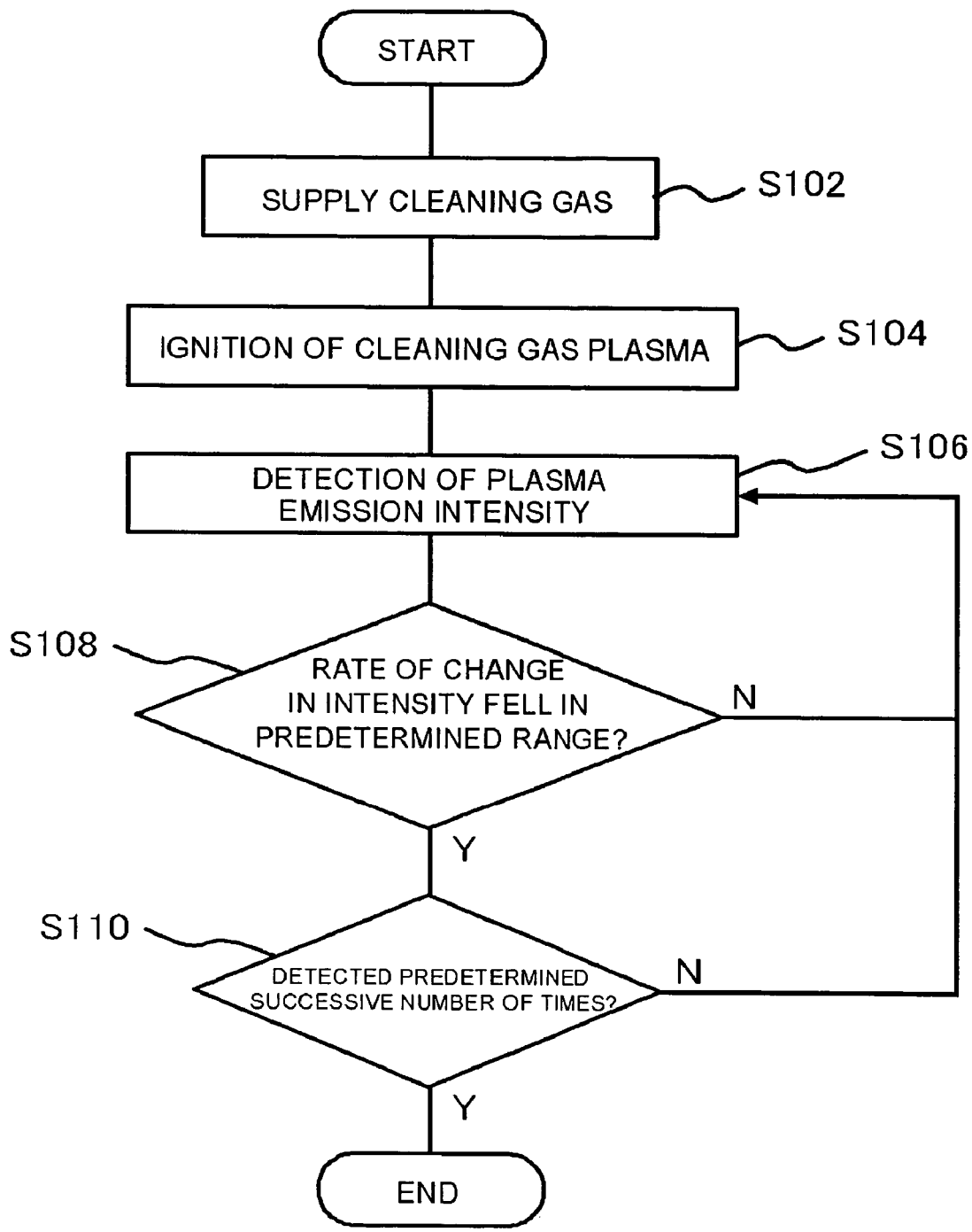
FIG. 4 is a flow chart showing a plasma cleaning process in the method of cleaning a plasma etching apparatus of the embodiment.
Figure 5:
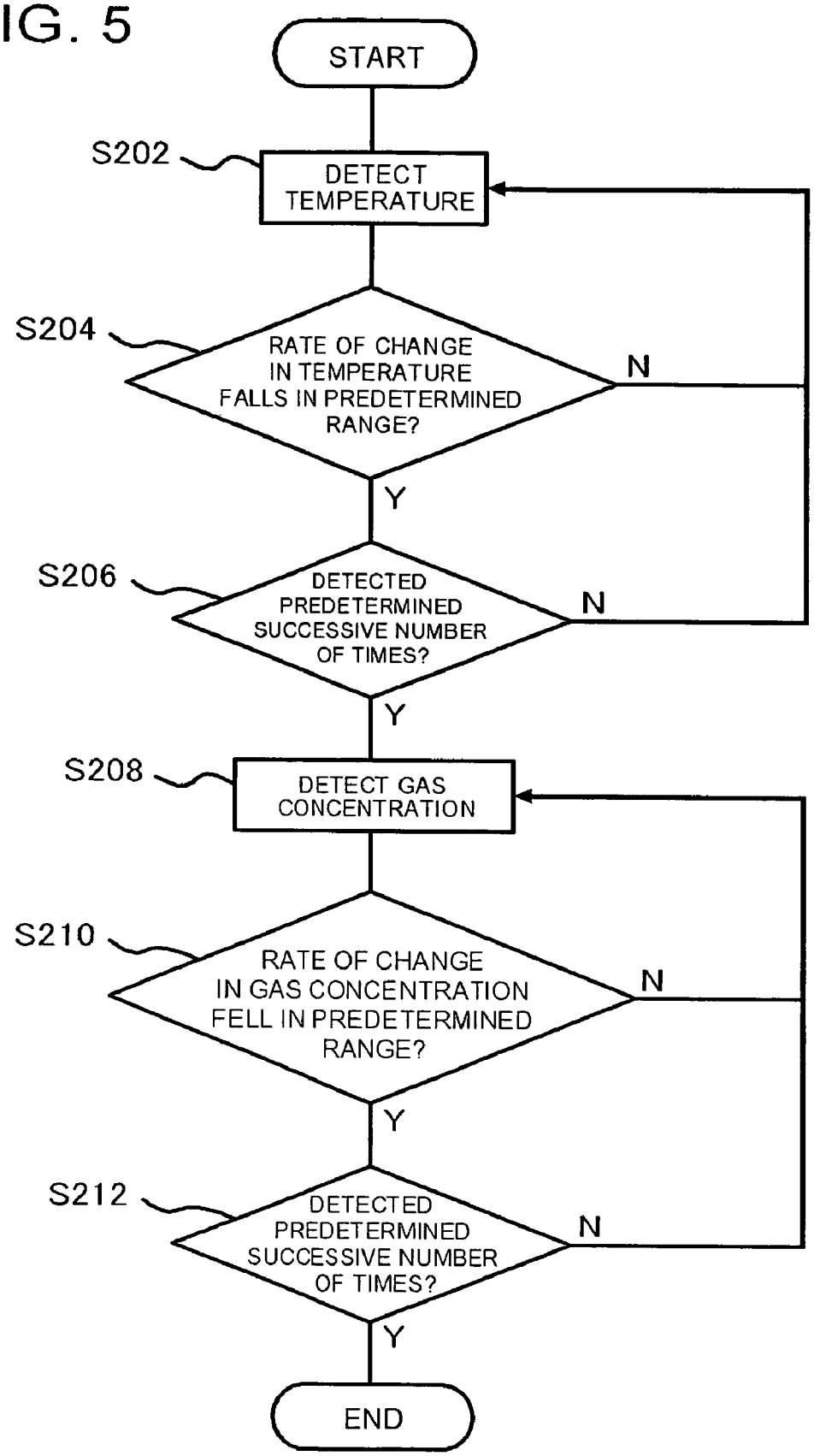
FIG. 5 is a flow chart showing an inert gas introduction process in the method of cleaning a plasma etching apparatus of the embodiment.

A method of cleaning a plasma etching apparatus in this embodiment will be explained referring to FIGS. 4 and 5. The explanation below will be made on a cleaning method proceeded in the plasma etching apparatus 100 shown in FIGS. 1 to 3.

The method of cleaning the plasma etching apparatus in this embodiment includes the process steps shown below:

(i) a step of supplying a cleaning gas into the chamber 102 of the plasma etching apparatus 100 (step 102);

(ii) a step of igniting a plasma of the cleaning gas in the chamber 102 (step 104); and (iii to iv) a step of allowing plasma cleaning to proceed in the chamber 102, by bringing the cleaning gas in a plasma form into contact with a deposit adhered on the inner wall of the chamber so as to etch off the deposit.

The step of allowing plasma cleaning to proceed in the chamber 102 includes:

(iii) a step of detecting intensity of plasma emission ascribable to the deposit in a time-dependent manner (step 106); and (iv) a step of terminating the plasma cleaning in the chamber, based on changes in the intensity of the plasma emission (steps 108 to 110).

The method will be explained below referring to the individual steps.

(i) Step 102

First, the cleaning gas is supplied into the chamber 102 of the plasma etching apparatus 100.

After completion of the dry etching process of a sample such as a wafer, the plasma etching apparatus 100 shown in FIG. 1 takes the wafer out from the chamber 102. The valve 112a is then opened, and the cleaning gas is introduced into the chamber 102 through the gas introduction pipe 112. An oxidative gas can be used as the cleaning gas. The oxidative gas can be exemplified by $O_2$, $O_3$, NO, $NO_2$, CO and so forth. Any fluorocarbon-base compound gas used in the etching process may remain in the chamber in the cleaning process.

(ii) Step 104

Next, a plasma of the cleaning gas is ignited in the chamber 102.

In the plasma etching apparatus 100 shown in FIG. 1, a high-frequency voltage is applied from the source high-frequency power supply 110 to the upper electrode 108 so as to ignite a plasma in the chamber 102, and to irradiate the inner wall of the chamber 102 with the plasma. This process allows plasma cleaning of a deposit adhered thereon to proceed.

(iii) Step 106

Intensity of plasma emission ascribable to the deposit is then detected in a time-dependent manner.

Figure 6:
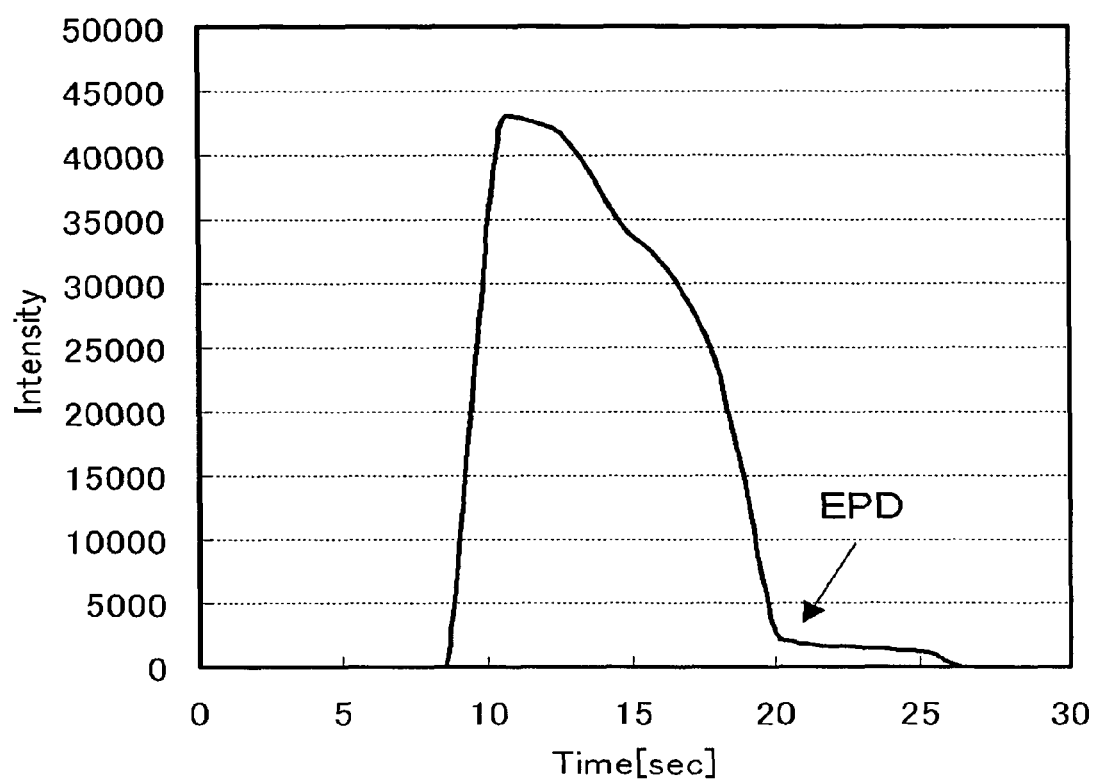
FIG. 6 is a graph showing a time course of plasma emission intensity in the embodiment.

The plasma comes into contact with the deposit adhered on the inner wall of the chamber 102. The plasma emission ascribable to the deposit generates. The CCD camera 114 detects intensity of the plasma emission in a time-dependent manner (for every unit time), while monitoring the plasma emission. As a consequence, a time course of the intensity of plasma emission is confirmed typically as shown in FIG. 6.

In this embodiment, an exemplary case where a CF-base compound deposit adheres on the inner wall of the chamber 102 will be explained. In this case, a plasma emission of COx will be confirmed. COx can be exemplified by CO, $CO_2$ and so forth. This embodiment will be explained referring to a case where changes in intensity of a CO plasma emission is confirmed, and more specifically referring to a case where changes in intensity observed at a wavelength in the plasma emission having a peak at around 520 nm is confirmed. It is to be noted that "at around 520 nm" herein means a range expressed by a predetermined allowance on both sides of 520 nm, and can typically be the range from approximately 518 nm to 522 nm.

(iv) Steps 108 to 110

The plasma cleaning in the chamber 120 is then terminated, based on changes in the plasma emission intensity (steps 108 to 110).

Steps 108 to 110 will be explained below, referring to FIG. 2 or 3.

More specifically, the emission intensity detection unit 132a detects a change in intensity of the plasma emission, and transmits a result of detection to the transmitter/receiver unit 134a. The transmitter/receiver unit 134a receives the result of detection, and transmits the result of detection to the processing unit 134b. The processing unit 134b calculates a rate of change in plasma emission intensity within a predetermined duration of time, based on the result of detection. The rate of change in plasma emission intensity can be calculated typically based on the amount of change in emission intensity within one second, showing a rate of change of −20% for an exemplary case where the intensity varied from 10,000 down to 8,000.

The processing unit 134b transmits thus-calculated rate of change to the judgment unit 134c.

Upon receiving of the rate of change in emission intensity from the processing unit 134b, the judgment unit 134c accesses the memory unit 136 and refers to the reference value. By this process, the judgment unit 134c judges whether the end point of plasma cleaning has reached or not, based on the emission intensity received from the processing unit 134b (step 108). This embodiment will be explained referring to a case where the end point of plasma cleaning is judged based on the rate of change in plasma emission intensity ascribable to the deposit.

In this embodiment, the judgment unit 134c judges that the end point of plasma cleaning has reached, if the rate of change in emission intensity was found to fall in the range from −20% or more and 5% or less. The memory unit 136 has, stored therein as described in the above, the reference values which are referred to when the end point of the plasma cleaning is judged. The judgment unit 134c accesses the memory unit 136, and compares the received rate of change in emission intensity with the stored reference value. If the rate of change in emission intensity received from the processing unit 134b matched to the reference value (from −20% to 5%, both ends inclusive), and the end point of plasma cleaning was judged as being reached, the judgment unit 134c advances the process to step 110. On the other hand, if the rate of change in emission intensity is smaller than −20% (−40%, for example), the process returns back to step 106, and the intensity of plasma emission ascribable to the deposit is detected again in a time-dependent manner.

Next, the judgment unit 134c judges whether the rate of change in emission wavelength received from the processing unit 134b was detected a predetermined successive number of times or not (step 110).

For the case where the rate of change in emission intensity was found to be smaller than −20% (−40%, for example), or for the case where a rate of change in emission intensity of −20% or more (−10%, for example) was observed but for the first time, the process returns back to step 106, and the intensity of plasma emission is detected again in a time-dependent manner. The predetermined successive number of times is not specifically limited, and may appropriately be set depending on objects to be cleaned, types of the plasma etching apparatus and so forth.

On the other hand, for the case where the rate of change in emission intensity was found to fall in the above-described numerical range, and the predetermined successive number of times was three, the judgment unit 134c judges termination of the plasma cleaning process. After judging the termination of the plasma cleaning process, the judgment unit 134c controls the etching unit 130 with the aid of the transmitter/receiver unit 134a, and makes it terminate supply of the cleaning gas, and application of high-frequency voltage. The plasma cleaning process is thus terminated.

In this embodiment, the plasma cleaning process is followed by the step of introducing the inert gas into the chamber 102.

In this embodiment, the step of introducing the inert gas includes the following steps:

(v) a step of detecting temperature of the inner wall of the chamber 102 in a time-dependent manner (step 202);

(vi) a step of terminating measurement of temperature of the inner wall of the chamber 102, based on changes in temperature of the inner wall of the chamber 102 (steps 204 to 206);

(vii) a step of detecting gas concentration of a predetermined compound in the chamber 102 in a time-dependent manner (step 208); and (viii) a step of terminating measurement of gas concentration in the chamber 102, based on changes in gas concentration in the chamber 102 (steps 210 to 212).

Steps 202 to 206, and steps 208 to 212 may be conducted according to any order of sequence.

The individual process steps will be explained below.

(v) Step 202

First, temperature of the inner wall of the chamber 102 is detected in a time-dependent manner.

More specifically, when the plasma cleaning process is terminated in the plasma etching apparatus 100 shown in FIG. 1, the inert gas is introduced through the gas introduction pipe 112 into the chamber 102, based on the information preliminarily stored. He gas, Ar gas, $N_2$ gas and so forth can be used as the inert gas. The evacuation pump 118 is then activated to begin evacuation of the chamber 102 through the gas discharge pipe 116.

Temperature of the inner wall of the chamber 102 is detected by the temperature sensor 122 in a time-dependent manner.

(vi) Steps 204 to 206

Next, whether the rate of change in temperature of the inner wall of the chamber 102 falls in a predetermined range or not is judged (step 204).

In the plasma etching apparatus 100 shown in FIG. 2, the temperature detection unit 132b detects temperature of the inner wall of the chamber 102, and then transmits the result to the transmitter/receiver unit 134a. The transmitter/receiver unit 134a receives the result of detection, and transmits the result of detection to the processing unit 134b. Based on the result of detection, the processing unit 134b calculates the rate of change in temperature within a predetermined period of time. The rate of change in temperature can be calculated typically based on temperature change within one second, and a change from 100° C. down to 80° C. is expressed as a rate of change of −20%.

The processing unit 134*b* transmits thus-calculated rate of change to the judgment unit 134*c*.

Upon receiving of the rate of change in temperature, the judgment unit 134*c* accesses the memory unit 136 to refer the reference values, and judges whether the rate of change in temperature received from the processing unit 134*b* falls in the predetermined range based on which the end point of introduction of the inert gas can be judged, or not.

In this embodiment, the judgment unit 134*c* judges the end point of introduction of the inert gas, when the rate of change in temperature was found to fall in the range from −20% to 5%, both ends inclusive. The memory unit 136 has stored therein, as described in the above, the reference values referred to when the end point of introduction of the inert gas is judged. The judgment unit 134*c* accesses the memory unit 136, and compares the received rate of change in temperature with the stored reference value. If the judgment unit 134*c* judges that the rate of change in temperature received from the processing unit 134*b* matched to the reference value (from −20% to 5%, both ends inclusive), and that the end point of introduction of the inert gas has been reached, the process advances to step 208. On the other hand, if the rate of change in emission intensity was found to be smaller than −20% (−40%, for example), the process returns back to step 202, and temperature of the inner wall of the chamber 102 is detected in a time-dependent manner.

Next, the judgment unit 134*c* judges whether the rate of change in temperature received from the processing unit 134*b* was detected a predetermined successive number of times or not (step 206).

For the case where the rate of change in temperature was found to be smaller than −20% (−40%, for example), or for the case where a rate of change in temperature of −20% or more (−10%, for example) was observed but for the first time, the process returns back to step 202, and temperature of the inner wall of the chamber 102 is detected again in a time-dependent manner.

On the other hand, for the case where the rate of change in temperature was found to fall in the above-described numerical range, and the predetermined successive number of times was three, the process advances to step 208.

(vii) Step 208

Gas concentration of a predetermined compound in the chamber 102 is detected in a time-dependent manner.

More specifically, in the plasma etching apparatus 100 shown in FIG. 1, the gas concentration of a predetermined compound in the chamber 102 is detected by the gas analyzer 120 in a time-dependent manner. A fluorocarbon-base compound or the like, used as an etching gas, can be exemplified as the predetermined compound.

Upon completion of step 208, the process then advances to the next step.

(viii) Steps 210 to 212

First, whether the rate of change in gas concentration in the chamber 102 falls in a predetermined range or not is judged (step 210).

More specifically, in the plasma etching apparatus 100 shown in FIG. 2, the gas concentration detection unit 132*c* detects gas concentration of a predetermined compound in the chamber 102, and transmits a result of detection to the transmitter/receiver unit 134*a*. The transmitter/receiver unit 134*a* receives the result of detection, and transmits the result of detection to the processing unit 134*b*. The processing unit 134*b* calculates the rate of change in gas concentration within a predetermined period of time, based on the result of detection. The rate of change in gas concentration can be calculated typically based on changes in gas concentration within one second, showing a rate of change of −20% for an exemplary case where the intensity varied from 10% down to 8%.

The processing unit 134*b* transmits thus-calculated rate of change to the judgment unit 134*c*.

Upon receiving of the rate of change in gas concentration from the processing unit 134*b*, the judgment unit 134*c* accesses the memory unit 136 to refer the reference value, and judges whether the rate of change in gas concentration received from the processing unit 134*b* falls in a predetermined range based on which the end point of introduction of the inert gas can be judged, or not.

In this embodiment, the judgment unit 134*c* judges that the end point of introduction of the inert gas has been reached, when the rate of change in gas concentration was found to fall in the range from −20% to 5%, both ends inclusive. The memory unit 136 has, stored therein as described in the above, the reference values which are referred to when the end point of introduction of the inert gas is judged. The judgment unit 134*c* compares thus-received rate of change in gas concentration with the stored reference value. If the judgment unit 134*c* judges that the rate of change in gas concentration received from the processing unit 134*b* matched to the reference value (from −20% to 5%, both ends inclusive), and that the end point of introduction of the inert gas has been reached, the process advances to step 212. On the other hand, if the rate of change in gas concentration was found to be smaller than −20% (−40%, for example), the process returns back to step 208, and again gas concentration in the chamber 102 is detected in a time-dependent manner.

Next, the judgment unit 134*c* judges whether the rate of change in gas concentration received from the processing unit 134*b* was detected a predetermined successive number of times (step 212).

For the case where the rate of change in gas concentration was found to be smaller than −20% (−40%, for example), or for the case where a rate of change in gas concentration of −20% or more (−10%, for example) was observed but for the first time, the process returns back to step 208, and the gas concentration is detected again in a time-dependent manner.

On the other hand, for the case where the rate of change in gas concentration was found to fall in the above-described numerical range and detected number of thus numeric value is three times, the step of introducing the inert gas is terminated.

After the plasma etching apparatus is cleaned in this way, another dry etching process of a sample, such as a wafer, is allowed to proceed.

Effects of the present invention will be explained below.

According to this embodiment, the end point of plasma cleaning can be confirmed by confirming plasma emission, and so that cleanliness of the inner wall of the chamber can be kept constant. It is therefore made possible to prevent the process to advance to the next step while being remained in an insufficient state of cleaning, and to suppress dimensional variation in line pitch among wafers in a single lot. Because the process advances to the next step after confirming the end point of plasma cleaning, an excessive plasma cleaning is avoidable, and thereby the throughput in the etching process can be improved.

A reason why such effect can be obtained is supposed to as follows.

When a fluorocarbon-base compound gas is used for the etching process, products derived from the compound can deposit on the inner wall of the chamber and on the wafer. Ratio of deposition of new products onto the inner wall of the chamber and onto the wafer (ratio of distribution) is supposed to vary depending on the amount of adhered product on the inner wall of the chamber. In other words, in the cleaning process, the ratio of adhesion of the product derived from the etching gas may vary between the inner wall of the chamber and the wafer, if the cleanliness of the inner wall of the chamber is insufficient, possibly resulting in increase in the amount of deposition on the wafer surface, and in the variation in line pitch among wafers in a single lot.

This sort of adhesion of the product onto the wafer has never attracted attention for conventional semiconductor devices, and instead it has been a general practice to carry out the cleaning for a constant duration of time irrespective of the amount of deposit adhered onto the inner wall of the chamber. However with recent ongoing trends in narrowing of a required level of line pitch, the variation in line pitch has been becoming more distinctive among wafers in a single lot in the micronized process.

The present inventors went through extensive investigations based on these findings, and found out that keeping of the amount of deposit on the inner wall of the chamber at a constant level can successfully solve the problem of the variation in line pitch among wafers in a single lot.

In other words, in this embodiment, the end point of cleaning is determined while confirming the plasma emission ascribable to the deposit, so that the amount of deposit adhered on the inner wall of the chamber can be controlled at a constant level. As a consequence, influences of the deposit adhered on the inner wall of the chamber can be controlled at a constant level, and thereby a plurality of wafers in a single lot can be etched under the same conditions. The dimensional variation in line pitch among wafers in a single lot can therefore be suppressed, and thereby the yield ratio of product improves. Confirmation of the end point of plasma cleaning based on the emission also improves the throughput of the etching process.

The method described in Japanese Laid-Open Patent Publication No. 2004-235361 relates to an etching process of semiconductor wafers, only aimed at confirming changes in wavelength in plasma emission so as to confirm the end point of the etching process. The method therefore could not allow selection of optimum cleaning conditions even if applied to cleaning of a plasma etching apparatus, and sometimes resulted in a longer time for the etching process as a whole, and in degradation of the throughput.

In contrast, this embodiment detects changes in intensity of the plasma emission ascribable to the deposit adhered inside the chamber in a time-dependent manner, and determines the end point of the plasma cleaning in the chamber, rather than confirming changes in wavelength of the plasma emission. The deposit adhered on the inner wall of the chamber can therefore be removed irrespective of the amount thereof, and thereby the dimensional variation in line pitch among wafers in a single lot can be suppressed.

This embodiment further includes a step of introducing the inert gas into the chamber, after completion of the plasma cleaning. This is successful in further suppressing the dimensional variation in line pitch in a single lot.

On the other hand, the conventional method of cleaning a plasma etching apparatus, based on cleaning for a predetermined duration of time, has sometimes resulted in dimensional variation in line pitch in a single lot, even if the cleaning was carried out for a long duration of time. This nonconformity has been becoming distinctive as the line pitch has become narrower.

Although reasons for this phenomenon remain unclear, it is supposedly ascribable to influences of the fluorocarbon-base compound gas residing in the chamber after completion of the etching process. More specifically, in the conventional chamber after cleaning, the fluorocarbon-base compound gas used for the etching of a first wafer remains. In the etching process for a second wafer, the amount of deposit on the wafer is supposed to increase as compared with that on the first wafer, due to influence of the residual gas. The influence has become distinctive among a plurality of wafers, and has sometimes resulted in the variation in line pitch among wafers in a single lot.

Another possible cause for the above-described phenomenon is that the amount of adhesion of the deposit may vary depending on temperature of the inner wall of the chamber. More specifically, it is presumed that the amount of adhesion of the deposit becomes small on the inner wall, and becomes large on the wafer, when the temperature of the inner wall of the chamber is high. The conventional cleaning method did not control temperature of the inner wall of the chamber, and has sometimes resulted in the variation in line pitch among wafers in a single lot.

The present inventors went through extensive investigations based on these findings, and found out that introduction of the inert gas into the chamber, after completion of the plasma cleaning, can more successfully suppress the dimensional variation in line pitch among wafers in a single lot. This effect becomes particularly distinctive by controlling both of temperature of the inner wall of the chamber and gas concentration of a predetermined compound.

The embodiments of the present invention described in the above referring to the attached drawings are mere examples of the present invention, and also any other various configurations are adoptable.

This embodiment controls the step of introducing the inert gas based on temperature of the inner wall of the chamber and gas concentration of a predetermined compound, wherein the control based on either one of them is also allowable.

EXAMPLE

[Experimental Case]
The chamber of the plasma etching apparatus was cleaned under conditions below, according to a flow chart shown in FIGS. 4, 5.
cleaning gas: $O_2$;
end point of plasma cleaning: a rate of change of plasma emission intensity of −20% to 5%, both ends inclusive, detected three successive times;
plasma emission: CO emission (emission peak at 520 nm or around);
inert gas: He gas; and
end point of introduction of inert gas: a rate of change in temperature of the inner wall of the chamber of −20% to 5%, both ends inclusive, detected three successive times/a rate of change in concentration of $C_4F_8$ gas of −20% to 5%, both ends inclusive, detected three successive times.

Figure 7:
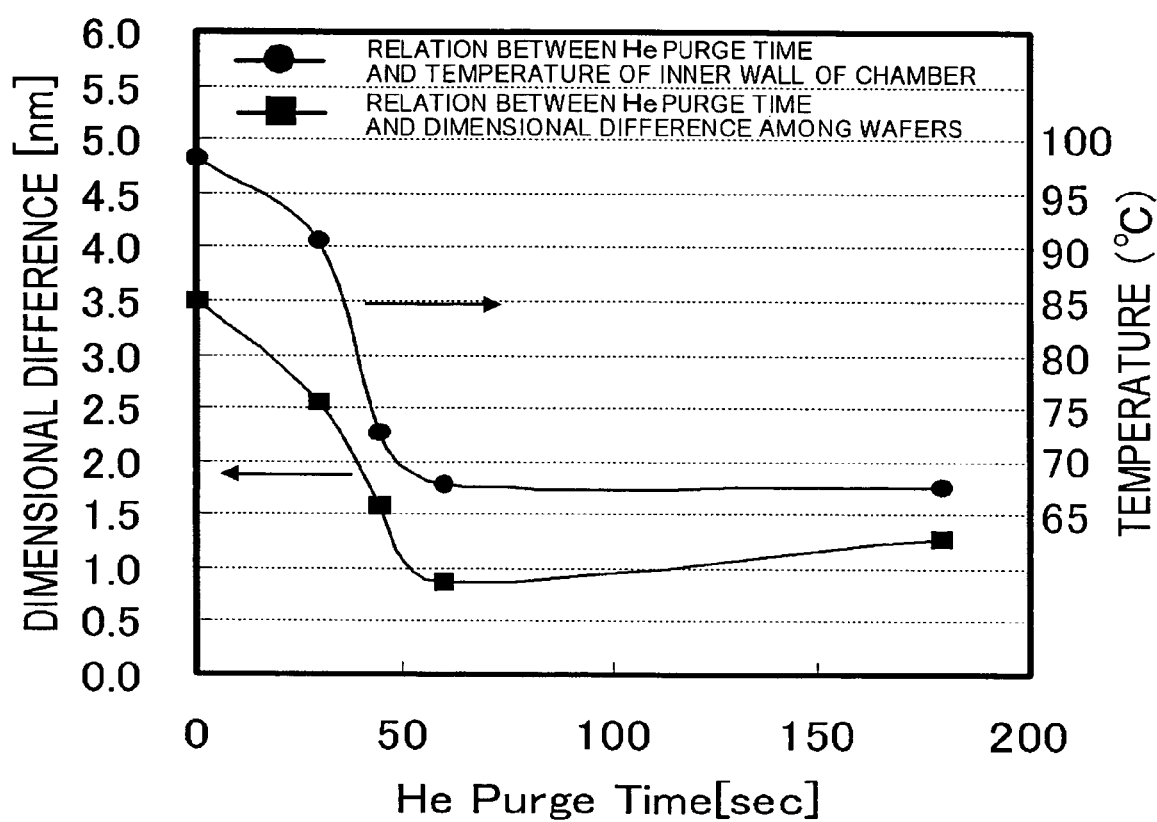
FIG. 7 is a graph showing relations between He purge time and line pitch, and between He purge time and rate of change in temperature of the inner wall of the chamber.
Figure 8:
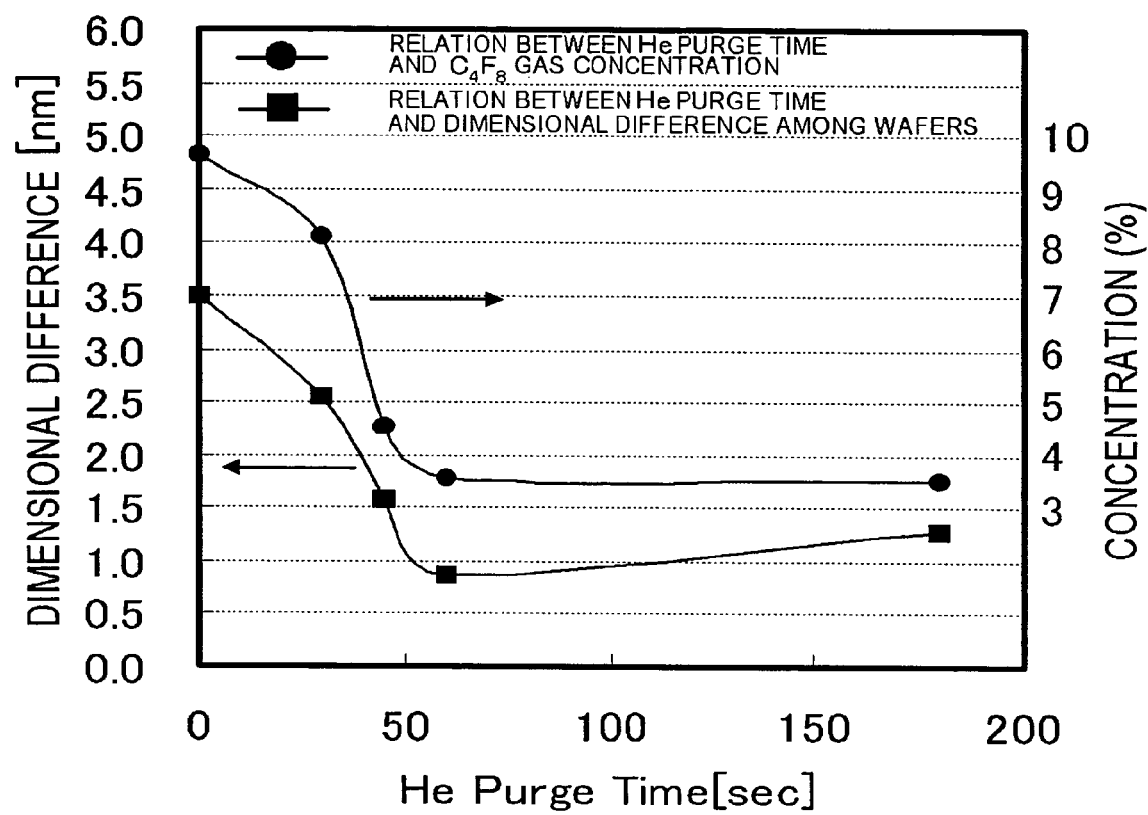
FIG. 8 is a graph showing relations between He purge time and line pitch, and between He purge time and gas concentration in the chamber.

As shown in FIG. 6, the plasma cleaning was terminated when the rate of change in plasma emission intensity fell in the range from −20% to 5%, both ends inclusive, three successive times. He gas was then introduced. As shown in FIG. 7, the rate of change in temperature of the inner wall of the chamber did not fall in the range from −20% to 5%, both ends inclusive, three successive times, at the individual purge times of shorter than 50 seconds (0 second, 30 seconds, 40 seconds). In this case, as shown in FIG. 8, also the rate of change in concentration of $C_4F_8$ gas used for the etching process did not fall in the range from −20% to 5%, both ends inclusive, three successive times. On the other hand, as shown in FIGS. 7, 8, both rates of change fell in the range from −20% to 5%, both ends inclusive, three successive times, at purge times of 60 seconds and 180 seconds.

As a consequence, at the individual He purge times (0 second, 30 seconds, 40 seconds) shorter than 50 seconds, difference in line pitch among wafers (first wafer and 24th wafer) in a single lot was approximately 1.5 nm to 3.5 nm. In contrast, the difference was 0.8 nm or around at a He purge time of 60 seconds. It was also found that the difference in line pitch was no more improved when the He purge time was longer than 60 seconds.

Another trial was made in that the plasma cleaning was terminated although the rate of change in plasma emission, shown in FIG. 6, did not fall in the range from −20% to 5%, both ends inclusive, three successive times, and the He purge was carried out for 60 seconds. This case, however, resulted in a large variation in line pitch among wafers in a single lot.

As has been described in the above, it was confirmed that variation in line pitch among wafers in a single lot can be suppressed, and throughput in the etching process can be improved, by confirming the end point of the plasma cleaning based on the plasma emission intensity. It was also confirmed that such effect becomes distinct by introducing the inert gas.

It is apparent that the present invention is not limited to the above embodiment, that may be modified and changed without departing from the scope and spirit of the invention.

What is claimed is:

1. A method of cleaning a plasma etching apparatus comprising:
    supplying a cleaning gas into a chamber of a plasma etching apparatus;
    igniting a plasma of said cleaning gas in said chamber;
    allowing plasma cleaning to proceed in said chamber by bringing said cleaning gas in a plasma form into contact with a deposit adhered on the inner wall of said chamber so as to etch off said deposit;
    detecting an intensity of plasma emission ascribable to said deposit adhered on said inner wall in a time-dependent manner;
    terminating the plasma cleaning in said chamber based on changes in the intensity of said plasma emission; and
    after terminating the plasma cleaning, introducing an inert gas into said chamber, detecting a rate of change of temperature of the inner wall of said chamber as a function of time, and terminating the introduction of said inert gas when the rate of change of the temperature of the inner wall of said chamber reaches a predetermined range.

2. The method of cleaning a plasma etching apparatus as claimed in claim 1, wherein terminating the plasma cleaning in said chamber occurs when the intensity of said plasma emission falls down to a predetermined value or below, or rate of change in the intensity of said plasma emission falls in a predetermined range.

3. The method of cleaning a plasma etching apparatus as claimed in claim 1, wherein said cleaning gas is a gas containing an oxidative gas.

4. The method of cleaning a plasma etching apparatus as claimed in claim 1, wherein the intensity of said plasma emission is emission intensity of COx.

5. The method of cleaning a plasma etching apparatus as claimed in claim 1, wherein the intensity of said plasma emission is such as observed at a wavelength in the plasma emission having a peak at around 520 nm.

\* \* \* \* \*